US012720813B2

(12) United States Patent
El Zammar et al.

(10) Patent No.: US 12,720,813 B2
(45) Date of Patent: Aug. 25, 2026

(54) SEMICONDUCTOR POWER DEVICE WITH IMPROVED RUGGEDNESS

(71) Applicant: NEXPERIA B.V., Nijmegen (NL)

(72) Inventors: Georgio El Zammar, Hamburg (DE); Tim Böttcher, Hamburg (DE); Massimo Cataldo Mazzillo, Nijmegen (NL); Sönke Habenicht, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 425 days.

(21) Appl. No.: 18/467,293

(22) Filed: Sep. 14, 2023

(65) Prior Publication Data

US 2024/0096933 A1 Mar. 21, 2024

(30) Foreign Application Priority Data

Sep. 15, 2022 (EP) .................................... 22195767

(51) Int. Cl.

| | |
|---|---|
| ***H10D 62/10*** | (2025.01) |
| ***H10D 8/50*** | (2025.01) |
| ***H10D 8/60*** | (2025.01) |
| ***H10D 30/60*** | (2025.01) |
| ***H10D 30/66*** | (2025.01) |
| ***H10D 30/80*** | (2025.01) |
| ***H10D 62/832*** | (2025.01) |

(52) U.S. Cl.

CPC ............. *H10D 62/106* (2025.01); *H10D 8/50* (2025.01); *H10D 8/60* (2025.01); *H10D 30/615* (2025.01); *H10D 30/665* (2025.01); *H10D 30/801* (2025.01); *H10D 62/105* (2025.01); *H10D 62/8325* (2025.01); *H10D 62/112* (2025.01)

(58) Field of Classification Search

CPC ............. H10D 62/106; H10D 62/8325; H10D 62/105; H10D 30/665; H10D 62/112

See application file for complete search history.

(56) References Cited

U.S. PATENT DOCUMENTS

| | | | | |
|---|---|---|---|---|
| 7,049,675 | B2 | 5/2006 | Kinoshita et al. | |
| 2019/0035884 | A1 * | 1/2019 | Bauer | H10D 62/60 |
| 2019/0165159 | A1 * | 5/2019 | Wehrhahn-Kilian | H10D 30/668 |
| 2020/0395440 | A1 * | 12/2020 | Kubouchi | H10D 84/038 |
| 2022/0199824 | A1 * | 6/2022 | Kinoshita | H10D 12/031 |

FOREIGN PATENT DOCUMENTS

| | | | |
|---|---|---|---|
| CN | 105977310 | A | 9/2016 |
| CN | 110379863 | A | 10/2019 |
| EP | 2341528 | A1 | 1/2010 |
| JP | H08167715 | A | 6/1996 |
| WO | 2019073776 | A1 | 4/2019 |

* cited by examiner

*Primary Examiner* — Jose R Diaz

(74) *Attorney, Agent, or Firm* — Ruggiero McAllister & McMahon LLC

(57) ABSTRACT

Aspects of the present disclosure relate to a semiconductor power device, in particular to a Silicon Carbide, SiC, Merged P-I-N Schottky (MPS) diode. The device includes an active area and a termination area adjacent the active area. The termination area includes first rings having a first polarity. By including second rings having a second polarity opposite to the first polarity, a reduced effect of interface charges on the performance of the semiconductor power device can be observed.

19 Claims, 3 Drawing Sheets

100

SEMICONDUCTOR POWER DEVICE WITH IMPROVED RUGGEDNESS

CROSS-REFERENCE TO RELATED APPLICATIONS

This application claims the benefit under 35 U.S.C. § 119(a) of European Application No. 22195767.3 filed Sep. 15, 2022, the contents of which are incorporated by reference herein in their entirety.

BACKGROUND

1. Field of the Disclosure

Aspects of the present disclosure relate to a semiconductor power device, in particular to a Silicon Carbide, SiC, Merged P-I-N Schottky, MPS, diode.

2. Description of the Related Art

High voltage power semiconductor devices in general and Silicon Carbide (SiC) products in particular use many structures surrounding the active area. Jointly, these structures are referred to as termination area. It is of utmost importance for these devices to design a robust termination area able to withstand high voltages in the kV range. The main role of the termination area is to spread the potential lines in a manner to avoid crowding at particular regions of the termination area. Consequently, the termination area helps reducing the electric field at the edge of the active area, and when well designed, the termination area spreads equally the field across all the elements of the termination area avoiding any extreme field crowding at weak spots.

Weak spots or areas can be caused by design issues, e.g. unoptimized dimensions, process variation, e.g. lithography misalignment, ion implantation and diffusion, e.g. dose, energy and activation temperature, as well as interface charges caused by the presence of a passivation in the termination area. When using a nitride-based passivation, these charges are "positive", meaning ionized acceptors will accumulate in the semiconductor body at the termination area in order to compensate the holes trapped at the interface. The impact of passivation charges can be crucial. It results in an undesired depletion region at 0V that reduces the effectivity of the termination area causing low or unstable reverse blocking capability, poor unclamped inductive switching ruggedness, high temperature and high-voltage reliability failures, and limits fields of application for such a product.

In known termination areas the impact of passivation charges is always visible. An example of a termination area uses the concept of p-doped rings implemented in an n-doped semiconductor substrate. The width and distance of these p-dopes rings increase when the distance to the active area increases, e.g. towards the end of the semiconductor device or saw lane. These rings are also known as floating guard rings or Kao rings. These rings can be coupled with a large, lowly doped p-type area called junction termination extension border.

WO2019073776A1 discloses an embodiment that comprises, within a first electroconductive type layer in a cell region, a JFET section connected to the first electroconductive type layer and having a higher concentration of a first electroconductive type dopant than the first electroconductive type layer, and a second electroconductive type electric field blocking layer disposed on both sides so as to sandwich the JFET section. In addition, the embodiment comprises, above the electric field blocking layer and the JFET section, a current dispersing layer connected to the JFET section and having a higher concentration of a first electroconductive type dopant than the first electroconductive type layer, and a second electroconductive type connecting layer that traverses the current dispersing layer from the current dispersing layer surface to reach the electric field blocking layer. The embodiment further comprises a Schottky electrode in contact with the current dispersing layer and the connecting layer that establishes a Schottky contact with the current dispersing layer, and a back surface electrode formed on the back surface.

JPH08167715 provides a high breakdown voltage semiconductor device that has a high initial breakdown voltage and in which aging deterioration is reduced even at BT test.

CN105977310 provides a silicon carbide power device terminal structure and a manufacturing method thereof.

Further devices are known from EP2341528A1, U.S. Pat. No. 7,049,675B2, and CN110379863A.

SUMMARY

According to an aspect of the present disclosure, a semiconductor power device is provided that comprises a semiconductor body including a semiconductor substrate and an epitaxial layer formed on the semiconductor substrate. An active area and a termination area adjacent the active area are arranged in the epitaxial layer.

The termination area comprises a plurality of first rings of a first polarity, and a plurality of second rings of a second polarity different from the first polarity. The first rings may be referred to as the abovementioned floating guard rings.

The semiconductor substrate and the epitaxial layer have the second polarity. A dopant concentration in the epitaxial layer associated with the second polarity is smaller than a dopant concentration in the second rings associated with the second polarity.

The Applicant has found that by including the second rings having the second polarity a reduced effect of the abovementioned surface charges on the performance of the semiconductor power device can be observed. Furthermore, by including the second rings, a controlled depletion region between the first rings can be obtained that renders the semiconductor power device less sensitive to process variation for example variation in lithography or ion implantation.

The plurality of first rings may extend farther towards the semiconductor substrate than the plurality of second rings. For example, the first and second rings may extend from an upper surface of the semiconductor body towards the semiconductor substrate. A depth along which the first rings extend into the semiconductor body typically lies in a range between 200 and 300 nanometer, and a depth along which the second rings extend into the semiconductor body typically lies in a range between 50 and 150 nanometer. In an embodiment, the first rings extend into the semiconductor body beyond the second rings. For example, the first rings extend more than 100 nanometer beyond the second rings, preferably 150 nanometer, more preferably 200 nanometer. Alternatively, the first rings may extend more than 100 percent beyond the second rings, preferably 150 percent, more preferably 200 percent.

The dopant concentration in the second rings associated with the second polarity can be at least 100 times larger than the dopant concentration in the epitaxial layer associated with the second polarity, preferably 1000 times larger, and more preferably 10000 times larger. As an example, the dopant concentration in the second rings associated with the second polarity may lie in range between 1E19 and 1E20 #/cm3.

The first rings and second rings can be arranged alternately. Additionally or alternatively, the first and second rings can be configured to be electrically floating during operation.

The termination area may further comprise a junction termination extension, JTE, border of the first polarity type, wherein the first and second rings are arranged inside the junction termination extension border. A dopant concentration of the JTE border associated with the first polarity can be 20 times smaller than a dopant concentration of the first rings associated with the first polarity, preferably 50 times smaller, more preferably 100 times smaller. For example, the dopant concentration of the first rings associated with the first polarity may lie in a range between 1E19 and 1E20 #/cm3, and the dopant concentration of the JTE border associated with the first polarity may lie in a range between 1E17 and 1E20 #/cm3.

The termination area may further comprise a plurality of floating JTE rings of the first polarity arranged spaced apart from the first and second rings, and spaced apart from, in so far as applicable, the abovementioned JTE border. A dopant concentration of the floating JTE rings associated with the first polarity may lie in a range between 1E17 and 1E18 #/cm3.

The termination area can be at least partially covered by a passivation layer. The passivation layer may comprise a passivation layer made of Silicon Nitride, Silicon Oxynitride, Silicon Oxide or Metallic Oxides. Additionally or alternatively, the passivation layer may comprise a field oxide for example made of Silicon Oxide. When the passivation layer comprises a field oxide, the field oxide may cover the termination area substantially in its entirety and optionally also part of the active area. This field oxide may be covered by other passivation layers, such as one or more of the layers mentioned above. When the passivation layer does not comprise the field oxide, the passivation layer may cover the termination area only partially.

The semiconductor power device may further comprise a channel stopper arranged at or near an edge of the semiconductor power device, wherein the termination area is arranged in between the channel stopper and the active area, and wherein the channel stopper is of the second polarity. A dopant concentration of the channel stopper associated with the second polarity may lie in a range between 1E18 and 1E20 #/cm3.

The abovementioned passivation layer may extend over the termination area from a region directly above the channel stopper towards the active area thereby covering at least part of the plurality of first and second rings. For example, at least 90 percent of the first and second rings may be covered, preferably at least 95 percent, and more preferably at least 98 percent.

The abovementioned field oxide may extend over the termination area from a region directly above the channel stopper towards the active area thereby fully covering the plurality of first and second rings.

The semiconductor power device may comprise a Merged P-I-N Schottky, MPS, diode. Other semiconductor power devices include but are not limited to MOSFETs, JFETs, Schottky barriers, and PN diodes.

With respect to the MPS diode, the active area comprises a conductive layer assembly comprising one or more conductive layers, such as a metal layers, and a plurality of mutually separated islands of the first polarity arranged in a current distribution layer of the second polarity. The conductive layer assembly forms Schottky contacts with the current distribution layer, and the conductive layer assembly forms Ohmic contacts with the plurality of islands of the first polarity. In some embodiments, an Ohmic contact is formed with a different metal or conductive layer than the Schottky contact. The combination of these different metal or conductive layers is referred to as conductive layer assembly. In addition, the conductive layer assembly may comprise relatively thick metal layers for providing low Ohmic resistance, especially when handling high currents.

Furthermore, the conductive layer assembly may form a first contact of the MPS diode, and the MPS diode may comprise a second contact arranged on the semiconductor substrate.

The current distribution layer can be formed by a well of the second polarity formed in the epitaxial layer, wherein a dopant concentration of the current distribution layer associated with the second polarity is 2 times larger than a dopant concentration of the epitaxial layer associated with the second polarity, preferably 3 times larger, more preferably 5 times larger.

The semiconductor substrate may comprise a Silicon Carbide substrate. However, the present disclosure equally relates to Silicon substrates, II-VI semiconductor material substrates, or III-V semiconductor material substrates such as GaN or AlGaN substrates.

The first polarity may correspond to p-type and the second polarity to n-type.

BRIEF DESCRIPTION OF DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 1:
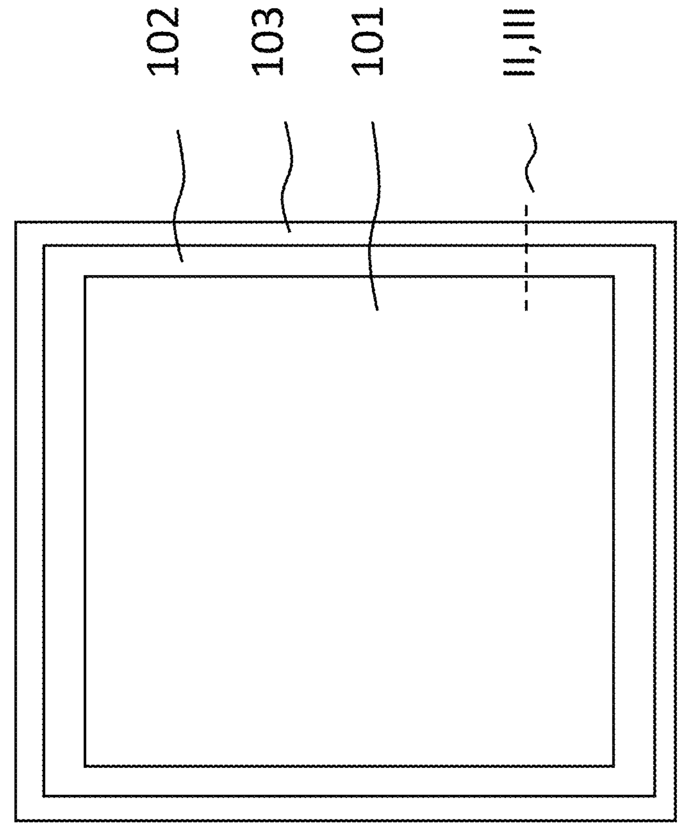
FIG. 1 illustrates a general top view of a semiconductor power device.

In FIG. 1, a general top view of a semiconductor power device 100 is shown that comprises an active area 101 in which a semiconductor device is realized, a termination area 102 adjacent to active area 101, and a channel stopper 103. Typically, semiconductor power device 100 is made from a semiconductor wafer on which a plurality of devices 100 are simultaneously formed. Channel stopper 103 may, prior to separating the devices, comprise structures, such as a saw lane, that allow the devices to be separated. Another structure that is or could be present in channel stopper 103 is a part of the passivation layer.

Figure 2:
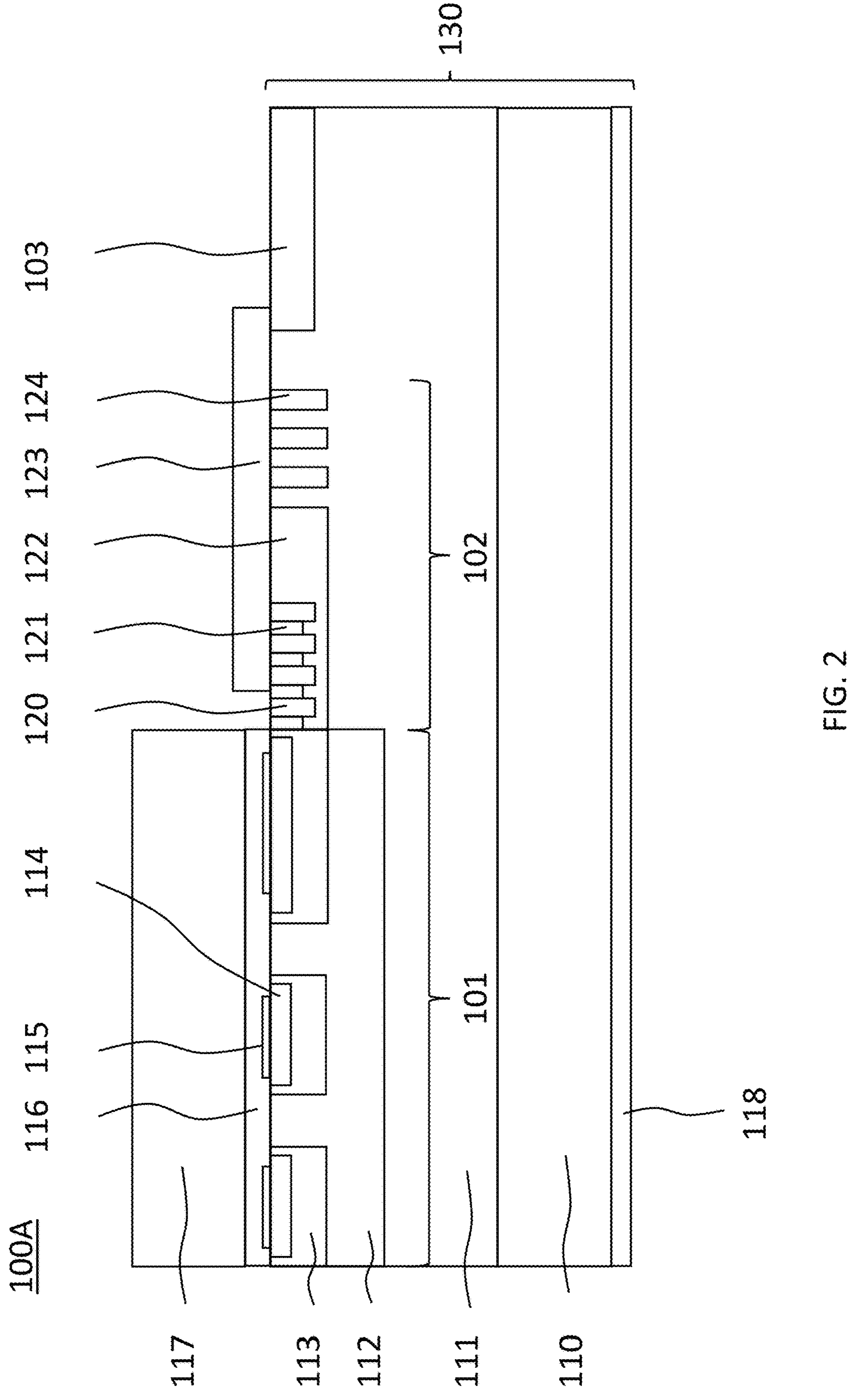
FIG. 2 illustrates a cross section of a first embodiment of a semiconductor power device in accordance with an aspect of the present disclosure.
Figure 3:
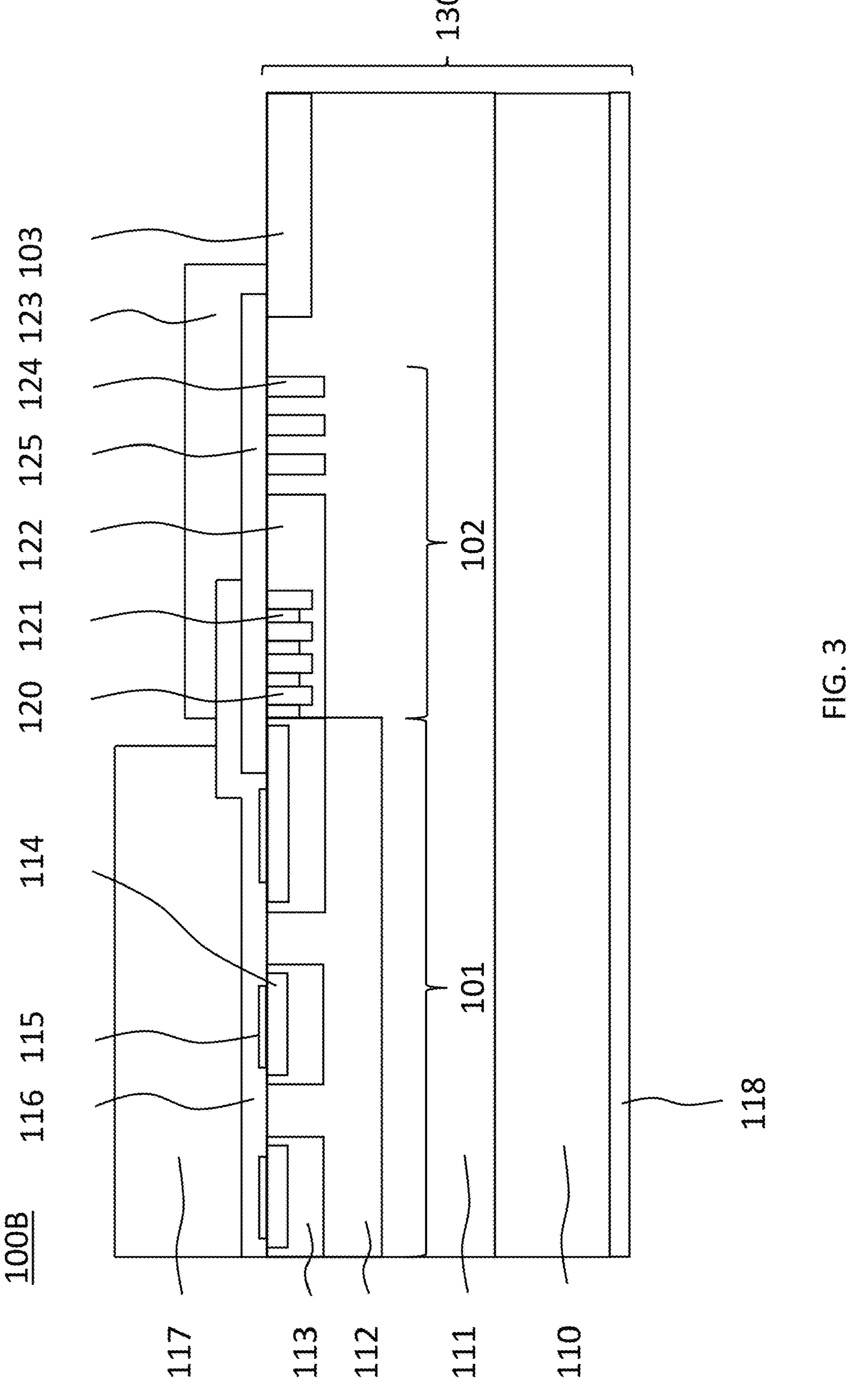
FIG. 3 illustrates a cross section of a second embodiment of a semiconductor power device in accordance with an aspect of the present disclosure.

FIGS. 2 and 3 present cross sections that correspond to the dashed line in FIG. 1. Here, it is noted that those figures present an exemplary embodiment of a semiconductor power device in the form of a SiC MPS diode. However, the present invention is not limited thereto and aspects of the present disclosure could equally be applied to other semiconductor power devices such as MOSFETs, JFETs, Schottky barriers, or PN diodes, realized on different semiconductor material technologies such as Si, GaN, AlGaN and other II-VI or III-V semiconductor materials.

Now referring to FIG. 2, MPS diode 100A comprises a semiconductor body 130 comprising an n-type SiC substrate 110 on which an n-type SiC epitaxial layer 111 has been grown. Typical dopant concentrations in these layers are 1E19 #/cm3 and 1E16 #/cm3, respectively. Inside epitaxial layer 111, a n-type current spreader 112 with a typical dopant concentration of 5E16 #cm3 has been formed using ion implantation. In turn, inside current spreader 112, a plurality of p-type wells 113 have been formed using ion implantation. Inside wells 113, highly doped p-type contact regions 114 have been formed using ion implantation to allow low Ohmic contact resistance with an NiSi conductive layer 115. Typical dopant concentrations for wells 113 and contact region 114 are 1E18 #/cm3 and 1E20 #cm3, respectively.

MPS diode 100A further comprises a Ti/TiN layer 116 covering the top surface of current spreader 112 and NiSi layer 115. At the regions where layer 116 contacts current spreader 112, i.e. in between wells 113, a Schottky contact is formed, whereas the NiSi layer 115 forms an Ohmic contact with contact region 114. Ti/TiN layer 116 is covered by a relatively thick AlCu layer 117 that forms a first contact terminal of MPS diode 100A. NiSi layer 115, Ti/TIN layer 116, and AlCu layer 117 may jointly be referred to as conductive layer assembly. Furthermore, a second contact terminal of MPS diode 100A is formed at a backside of SiC substrate 110.

Termination area 102 comprises a plurality of p-type first rings 120 having a typical dopant concentration of 1E20 #/cm3. In between p-type first rings 120, a plurality of n-type second rings 121 are arranged that have a typical dopant concentration of 5E19 #/cm3. As shown, first rings 120 extend farther towards SiC substrate 110 than rings 121. For example, a height of first rings 120 equals 0.3 micrometer, whereas a height of second rings 121 equals 0.15 micrometer.

Both first and second rings 120,121 are provided inside a p-type JTE border 122 having a typical dopant concentration of 5E17 #/cm3. Adjacent to JTE border 122, a plurality of p-type JTE rings 124 are arranged that have a typical dopant concentration of 5E17 #/cm3.

In between channel stopper 103 and active area 101, a passivation layer 123 is provided that is made of Silicon Nitride, Silicon Oxynitride, Silicon Oxide, Metallic Oxide or a suitable combination thereof. As shown, passivation layer 123 does not extend over the entire surface between channel stopper 103 and active area 101. Furthermore, as shown, an n-type second ring 121 is arranged in between p-type well 113 and the first of the p-type first rings 120.

Rings 120, 121, 124 are generally electrically floating during operation.

FIG. 2 presents several structures inside termination area 102. More in particular, MPS diode 100A comprises first rings 120, second rings 121, JTE border 122, and JTE rings 124. Among these structures, JTE border 122 and JTE rings 124 are optional. Several different embodiments are therefore possible according to aspects of the present disclosure as outlined in the list below:

- Embodiment 1: rings 120, rings 121, JTE border 122, JTE rings 124 (as shown in FIG. 2);
- Embodiment 2: rings 120, rings 121;
- Embodiment 3: rings 120, rings 121, JTE border 122; and
- Embodiment 4: rings 120, rings 121, JTE rings 124.

The list above indicates which structures are possible in the various different embodiments.

FIG. 3 illustrates a further MPS diode 100B that differs from MPS diode 100A in that a field oxide 125 made of Silicon Oxide is used as passivation layer instead of passivation layer 123 for directly contacting the top surface of semiconductor body 130. Contrary to passivation layer 123, field oxide 125 spans the entire surface between channel stopper 103 and active area 101. In addition, Ti/TiN layer 116 partially covers field oxide 125. In addition, a passivation layer 123 is arranged above part of Ti/TiN layer 116 and field oxide 125.

In the embodiments of FIGS. 2 and 3, a separate conductive layer, i.e. NiSi layer 115, was used for realizing an Ohmic contact. In other embodiments, a same conductive layer, for example comprising one or more metal layers, may be used for simultaneously forming the Ohmic contact to p-type wells 113 and the Schottky contacts to current spreader 112.

The scope of the present disclosure includes any novel feature or combination of features disclosed therein either explicitly or implicitly or any generalization thereof irrespective of whether or not it relates to the claimed invention or mitigate against any or all of the problems addressed by the present invention. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A semiconductor power device, comprising:

a semiconductor body including a semiconductor substrate and an epitaxial layer formed on the semiconductor substrate;

an active area and a termination area adjacent the active area arranged in the epitaxial layer;

wherein the termination area comprises a plurality of first rings of a first polarity, and a plurality of second rings of a second polarity different from the first polarity, wherein the plurality of first rings extends farther towards the semiconductor substrate than the plurality of second rings;

wherein the semiconductor substrate and the epitaxial layer have the second polarity;

wherein the epitaxial layer has a dopant concentration associated with the second polarity that is smaller than a dopant concentration in the second rings associated with the second polarity; and wherein the termination area further comprises a junction termination extension (JTE) border of the first polarity type, and wherein the first and second rings are separately formed from and arranged inside the junction termination extension border.

2. The semiconductor power device according to claim 1, wherein the first rings associated with the first polarity have a dopant concentration that is higher than a dopant concentration of the JTE border associated with the first polarity.

3. The semiconductor power device according to claim 2, wherein the dopant concentration of the first rings associated with the first polarity lies in a range between 1E19 and 1E20 #/cm3, and wherein the dopant concentration of the JTE border associated with the first polarity lies in a range between 1E17 and 1E20 #/cm3.

4. The semiconductor power device according to claim 2, wherein the plurality of first rings extends farther towards the semiconductor substrate than the plurality of second rings; and wherein the first rings extend more than 100 nanometers beyond the second rings; and/or wherein the first rings extend more than 100 percent beyond the second rings.

5. The semiconductor power device according to claim 2, wherein the dopant concentration in the second rings associated with the second polarity is at least 100 times larger than the dopant concentration in the epitaxial layer associated with the second polarity.

6. The semiconductor power device according to claim 2, wherein the first rings and second rings are arranged alternately.

7. The semiconductor power device according to claim 1, wherein the first rings extend more than 100 nanometers beyond the second rings; and/or wherein the first rings extend more than 100 percent beyond the second rings.

8. The semiconductor power device according to claim 1, wherein the dopant concentration in the second rings associated with the second polarity is at least 100 times larger than the dopant concentration in the epitaxial layer associated with the second polarity.

9. The semiconductor power device according to claim 1, wherein the first rings and second rings are arranged alternately.

10. The semiconductor power device according to claim 9, wherein the termination area further comprises a plurality of floating JTE rings of the first polarity arranged spaced apart from the first and second rings and spaced apart from the JTE border.

11. The semiconductor power device according to claim 1, wherein the first and second rings are configured to be electrically floating during operation.

12. The semiconductor power device according to claim 1, wherein the termination area is at least partially covered by a passivation layer;

wherein the passivation layer comprises a passivation layer made of a material selected from the group consisting of Silicon Nitride, Silicon Oxynitride, Silicon Oxide, and Metallic Oxide; and/or wherein the passivation layer comprises a field oxide.

13. The semiconductor power device according to claim 12, further comprising a channel stopper arranged at or near an edge of the semiconductor power device, wherein the termination area is arranged in between the channel stopper and the active area, and wherein the channel stopper is of the second polarity.

14. The semiconductor power device according to claim 12, wherein, when the passivation layer is made of a material selected from the group consisting of Silicon Nitride, Silicon Oxynitride, Silicon Oxide and Metallic Oxide, and extends over the termination area from a region directly above the channel stopper towards the active area, a part of the plurality of first and second rings is covered.

15. The semiconductor power device according to claim 12, wherein, when the passivation layer comprises the field oxide, it extends over the termination area from a region directly above the channel stopper towards the active area thereby fully covering the plurality of first and second rings.

16. The semiconductor power device according to claim 1, wherein the semiconductor power device comprises a device selected from the group consisting of a Merged P-I-N Schottky (MPS) diode, a MOSFET, a JFET, a Schottky barrier, and a PN diode.

17. The semiconductor power device according to claim 16, wherein the semiconductor power device comprises a MPS diode, and wherein the active area comprises:

a conductive layer assembly comprising one or more conductive layers;

a plurality of mutually separated islands of the first polarity arranged in a current distribution layer of the second polarity;

wherein the conductive layer assembly forms Schottky contacts with the current distribution layer;

wherein the conductive layer assembly forms Ohmic contacts with the plurality of islands of the first polarity;

wherein the conductive layer assembly forms a first contact of the MPS diode; and wherein the MPS diode comprises a second contact arranged on the semiconductor substrate.

18. The semiconductor power device according to claim 17, wherein the current distribution layer is formed by a well of the second polarity formed in the epitaxial layer, and wherein the current distribution layer associated with the second polarity has a dopant concentration that is 2 times larger than a dopant concentration of the epitaxial layer associated with the second polarity.

19. The semiconductor power device according to claim 1, wherein the semiconductor substrate comprises a Silicon Carbide substrate; and/or wherein the first polarity corresponds to p-type and the second polarity to n-type.

* * * * *